US012716841B2

(12) United States Patent
Tabata et al.

(10) Patent No.: US 12,716,841 B2
(45) Date of Patent: Aug. 25, 2026

(54) METHOD FOR EVALUATING RESIST POLYMER

(71) Applicant: MARUZEN PETROCHEMICAL CO., LTD., Tokyo (JP)

(72) Inventors: Daisuke Tabata, Ichihara (JP); Tatsuya Tsukamoto, Ichihara (JP); Yoshiyuki Furuya, Ichihara (JP); Ryo Sato, Ichihara (JP)

(73) Assignee: Maruzen Petrochemical Co., LTD., Tokyo (JP)

( * ) Notice: Subject to any disclaimer, the term of this patent is extended or adjusted under 35 U.S.C. 154(b) by 55 days.

(21) Appl. No.: 18/548,961

(22) PCT Filed: Mar. 25, 2022

(86) PCT No.: PCT/JP2022/014229

§ 371 (c)(1),
(2) Date: Sep. 5, 2023

(87) PCT Pub. No.: WO2022/210319

PCT Pub. Date: Oct. 6, 2022

(65) Prior Publication Data

US 2024/0175814 A1 May 30, 2024

(30) Foreign Application Priority Data

Mar. 31, 2021 (JP) ................................ 2021-061698

(51) Int. Cl.

| | |
|---|---|
| ***G01N 21/59*** | (2006.01) |
| ***C08F 220/18*** | (2006.01) |
| ***C08F 220/28*** | (2006.01) |
| ***G03F 7/038*** | (2006.01) |
| ***G03F 7/039*** | (2006.01) |

(52) U.S. Cl.

CPC ....... *G01N 21/59* (2013.01); *C08F 220/1806* (2020.02); *C08F 220/283* (2020.02); *G03F 7/038* (2013.01); *G03F 7/039* (2013.01)

(58) Field of Classification Search

CPC .... G01N 21/59; G01N 15/075; G01N 21/272; G01N 21/94; G01N 21/82; G01N 15/06; G01N 33/0095; C08F 220/1806; C08F 220/283; G03F 7/038; G03F 7/039; G03F 7/0397; G03F 7/16; G03F 7/004; G03F 7/26

See application file for complete search history.

(56) References Cited

U.S. PATENT DOCUMENTS

| | | | | |
|---|---|---|---|---|
| 7,339,671 B2 * | 3/2008 | Peng | G01N 21/51 356/244 |
| 2004/0076546 A1 * | 4/2004 | Bissett | G01N 21/82 422/68.1 |
| 2016/0200849 A1 * | 7/2016 | Yasuda | G03F 7/0048 526/270 |
| 2022/0213243 A1 * | 7/2022 | Mukai | G03F 7/039 |
| 2023/0242467 A1 * | 8/2023 | Hakoda | C07C 37/72 568/801 |

FOREIGN PATENT DOCUMENTS

| | | | | |
|---|---|---|---|---|
| JP | 2005-091407 A | | 4/2005 | |
| JP | 2011-048354 A | | 3/2011 | |
| JP | 2012-068471 A | | 4/2012 | |
| JP | 2013057025 A | * | 3/2013 | |
| JP | 2013-214032 A | | 10/2013 | |
| JP | 2015048444 A | * | 3/2015 | |
| JP | 2019-085554 A | | 6/2019 | |
| KR | 20100110984 A | * | 10/2010 | G11B 5/6005 |

OTHER PUBLICATIONS

Taiwanese Office Action (with English translation) dated Oct. 4, 2024 (Application No. 111112123).
International Search Report and Written Opinion (Application No. PCT/JP2022/014229) dated Jun. 14, 2022 (8 pages).
English translation of the International Preliminary Report on Patentability (Chapter I) dated Oct. 12, 2023 (Application No. PCT/JP2022/014229).
Extended European Search Report dated Mar. 10, 2025 (Application No. 22780533.0).
Korean Office Action (with English translation) dated Aug. 5, 2025 (Application No. 10-2023-7027835).
Japanese Office Action (with English translation) dated Feb. 13, 2026 (Application No. 2023-511154).
Japanese Office Action for Japanese Application No. 2023-511154 dated Jun. 26, 2026.
Chinese Office Action for Chinese Application No. 202280021569.9 dated Apr. 11, 2026.
Korean Office Action for Korean Application No. 10-2023-7027835 dated Jun. 5, 2026.

* cited by examiner

*Primary Examiner* — Michelle M Iacoletti
*Assistant Examiner* — Maher Yazback
(74) *Attorney, Agent, or Firm* — Muncy, Geissler, Olds & Lowe, P.C.

(57) ABSTRACT

[Problem to be solved] An object of the present invention is to provide a method for evaluating the dissolution properties of a resist polymer, which method allows for an easy evaluation without requiring complicated processes, and with a high sensitivity.
[Solution] The method for evaluating the dissolution properties of a resist polymer according to the present invention includes the following steps (i) to (iii): the step (i) of dissolving the resist polymer in a solvent to prepare a test solution; the step (ii) of adding a solvent dropwise to the test solution while stirring the test solution, and measuring in real time the weight of the solvent added dropwise and the change in the turbidity of the test solution, as the dropwise addition proceeds; and the step (iii) of calculating the amount of the solvent added dropwise until the turbidity of the test solution reaches a predetermined value.

12 Claims, No Drawings

METHOD FOR EVALUATING RESIST POLYMER

BACKGROUND OF THE INVENTION

Field of the Invention

The present invention relates to a method for evaluating a resist polymer. More particularly, the present invention relates to a method for evaluating the dissolution properties of a resist polymer. Further, the present invention relates to a method for producing a resist polymer, the method including the evaluation method.

Background Art

In the field of resists for use in the production of semiconductors, the advances in lithography techniques and generational shift from KrF, ArF, ArF immersion, multiple patterning, EUV and to EB, are underway. Such technological advances have enabled the formation of even finer patterns. On the other hand, however, this led to an increased risk that even the presence of smaller foreign substances could affect the pattern formation, and in cutting-edge lithography applications, that extremely trace amounts of foreign substances such as impurities and insoluble or poorly-soluble components contained in resists could be the sources of defects. While extremely trace amounts of foreign substances such as impurities and insoluble or poorly-soluble components are present in a polymer as a raw material for preparing a resist composition, the detection and reduction of such foreign substances are strongly demanded for the purpose of improving the yield in the production process of a semiconductor. Therefore, a technology which enables to easily evaluate and quantify the dissolution properties of a resist polymer, particularly, to easily evaluate and quantify insoluble or poorly-soluble components in the resist polymer is expected.

To evaluate the content of extremely trace amounts of insoluble components contained in a polymer, several methods have been developed in which the manner of the precipitation of the insoluble components is evaluated when the solubility of the polymer is changed by adding a poor solvent, for example, to a solution obtained by dissolving the polymer in a solvent.

Patent Document 1 discloses a method in which: the dynamic light scattering of a solution of a radiation sensitive resin in a resist solvent is measured; a coefficient that indicates the change in the diffusion coefficient of the radiation sensitive resin in the solution associated with the change in the concentration of the solution is determined; and the development properties of the radiation sensitive resin are evaluated by the coefficient.

Patent Document 2 discloses a method in which: the particle size distribution of a solution of a copolymer for use in lithography is measured by dynamic light scattering; a poor solvent is added to the solution, and the amount of the poor solvent added until the scattering intensity at the particle size at which the maximum scattering intensity is shown is decreased to a predetermined intensity by the addition of the poor solvent, is determined; and the lithographic properties of a composition containing the copolymer for use in lithography are evaluated by the amount of the poor solvent added.

Patent Document 3 discloses a method in which: a poor solvent is added to a solution of a copolymer for use in lithography; the amount of the poor solvent added until the turbidity of the solution changes to a predetermined turbidity by the addition of the poor solvent, is determined; and the lithographic properties of a composition containing the copolymer for use in lithography are evaluated by the amount of the poor solvent added.

Patent Document 4 discloses a method in which the turbidity or the transmittance of a solution containing a polymer for use in lithography, and a good solvent and a poor solvent for the polymer, is measured using a sealed or substantially sealed measuring container.

CITATION LIST

Patent Documents

Patent Document 1: JP 2005-91407 A
Patent Document 2: JP 2011-48354 A
Patent Document 3: JP 2012-68471 A
Patent Document 4: JP 2013-214032 A

SUMMARY OF THE INVENTION

Technical Problem

However, each of the methods disclosed in Patent Documents 1 to 3 requires considerable time and trouble, because it is necessary to prepare and measure a plurality of test solutions, for example, for varying the concentration of the solution of the polymer to be analyzed, adding the poor solvent in stages, and/or the like. Further, in the turbidity measurement and the transmittance measurement in Patent Document 3 or 4, the optical path length in the measurement is 10 mm, which is insufficient for analyzing a minute difference in the turbidity of the solution.

Accordingly, an object of the present invention is to provide a method for evaluating the dissolution properties of a resist polymer, particularly, evaluating insoluble or poorly-soluble components in the resist polymer, which method allows for an easy evaluation without requiring complicated processes, and with a high sensitivity.

Solution to Problem

The present inventors have found out, as a result of intensive studies to achieve the above-mentioned object, that the object can be achieved by evaluating the dissolution properties of a resist polymer using parameters related to turbidity, thereby completing the present invention.

Specifically, the present invention provides the following inventions.

[1] A method for evaluating the dissolution properties of a resist polymer, the method including the following steps (i) to (iii):

- the step (i) of dissolving the resist polymer in a solvent to prepare a test solution;
- the step (ii) of adding a solvent dropwise to the test solution while stirring the test solution, and measuring in real time the weight of the solvent added dropwise and the change in the turbidity of the test solution, as the dropwise addition proceeds; and
- the step (iii) of calculating the amount of the solvent added dropwise until the turbidity of the test solution reaches a predetermined value.

[2] The method for evaluating the dissolution properties of a resist polymer according to [1], wherein a container into which the test solution is introduced when measuring the turbidity in the step (ii) is an Erlenmeyer flask, and wherein the test solution is stirred by orbital shaking.

[3] A method for producing a resist polymer, the method including:

the step of obtaining the resist polymer; and the step of evaluating the dissolution properties of the resulting resist polymer, using the method for evaluating the dissolution properties of a resist polymer according to [1] or [2].

Advantageous Effects of Invention

The present invention enables to evaluate the dissolution properties of a resist polymer easily without requiring complicated processes, and with a high sensitivity. Therefore, it is possible to reduce the labor required for the evaluation and measurement of the dissolution properties of a resist polymer.

DETAILED DESCRIPTION OF THE INVENTION

<Method for Evaluating Resist Polymer>

The evaluation method according to the present invention is a method for evaluating the dissolution properties of a resist polymer (namely, a polymer for use in a resist) in a solvent, particularly, evaluating an insoluble or poorly-soluble component or components (hereinafter, referred to as "insoluble or poorly-soluble components") in the resist polymer, and includes the following steps (i) to (iii).

(Step (i): Step of Preparing Test Solution)

The step (i) is a step of dissolving the resist polymer in a solvent to prepare a test solution. At this time, it is preferred that the polymer be completely dissolved, and to achieve this end, the solvent is preferably a good solvent for the polymer.

The good solvent to be used may be selected as appropriate from known resist solvents used for preparing resist compositions.

Specific examples of the good solvent include tetrahydrofuran, 1,4-dioxane, acetone, methyl ethyl ketone, methyl isobutyl ketone, cyclohexanone, cyclopentanone, 2-heptanone, ethylene glycol monomethyl ether, ethylene glycol monoethyl ether, ethylene glycol monoethyl ether acetate, propylene glycol monomethyl ether, propylene glycol monomethyl ether acetate, ethyl acetate, butyl acetate, methyl lactate, ethyl lactate, butyl lactate, N,N-dimethylformamide, dimethyl sulfoxide, N-methylpyrrolidone and γ-butyrolactone. These good solvents may be used singly, or as a mixture of a plurality of solvents.

The test solution preferably has a polymer concentration of from 2 to 25% by mass, and more preferably from 5 to 15% by mass.

The "good solvent" in the present specification refers to a solvent capable of completely dissolving the resist polymer at normal temperature (25° C.) in an amount of solvent of not more than five times the mass of the polymer. It is particularly preferred to use a solvent capable of completely dissolving the resist polymer in an amount of solvent of not more than three times the mass of the polymer. The good solvent to be used in the test solution may be a single kind of solvent, or a mixture of two or more kinds thereof. In the case using a mixed solvent, any mixture of good solvents can be used as long as the mixture after mixing satisfies the above-described requirement for the good solvent.

The temperature for preparing the test solution is not particularly limited. However, it is better to prepare the test solution within the temperature range in which the thermal degradation of the polymer, such as the elimination of an acid-degradable group in the polymer, can be prevented. The test solution is preferably prepared at a temperature of 60° C. or lower, more preferably 40° C. or lower, and most preferably at normal temperature.

(Step (ii): Step of Measuring Turbidity)

The step (ii) is a step of adding a solvent dropwise to the test solution prepared in the step (i) while stirring the test solution, and measuring in real time the change in the turbidity of the test solution, and the weight of the solvent added dropwise, as the dropwise addition proceeds.

The solvent to be added dropwise is not particularly limited. However, the solvent is preferably a poor solvent for the polymer, since the dropwise addition of the solvent is carried out in order to cause the aggregation and precipitation of the insoluble or poorly-soluble components in the polymer, by arbitrarily reducing the solubility of the polymer in the test solution. The solvent may also be a mixed solvent of a poor solvent and a good solvent. Further, the solvent to be added dropwise may be a good solvent depending on the case, because there are cases where even the dropwise addition of a good solvent may cause the aggregation and precipitation of the insoluble or poorly-soluble components due to the change in the concentration of the polymer. It is better to select a solvent compatible with the good solvent used for the preparation of the test solution, from the solvents as described above.

Specific examples of the poor solvent include pentane, hexane, heptane, octane, cyclohexane, methylcyclohexane, benzene, toluene, xylene, diethyl ether, diisopropyl ether, methanol, ethanol, isopropanol and water.

In the present invention, the solvent is added dropwise while stirring the test solution. The stirring is preferably carried out by a method which does not cause any problem, such as the occurrence of air bubbles in the test solution, in the measurement of the turbidity or the transmittance. For example, the stirring is preferably carried out by orbital shaking.

The optimum amount of the poor solvent to be added dropwise varies depending on the molecular weight and the composition of the polymer. In general, however, the poor solvent is preferably added dropwise in an amount within the range of from 1 to 50% by mass, and more preferably from 2 to 30% by mass, with respect to the amount of the test solution. In cases where the dropwise addition of an extremely small amount of poor solvent causes turbidity in the test solution, it is thought that the solubility of the polymer in the poor solvent is too low. In such cases, an adjustment can be made, for example, by changing the type of the poor solvent to be added dropwise, or using a mixed solvent of a poor solvent and a good solvent, instead.

If the speed of dropwise addition of the poor solvent is too high, it results in a situation where the turbidity is measured before the solution reaches equilibrium, which is not preferred. When a small amount of poor solvent is added dropwise to a solution of the polymer, turbidity or the precipitation of the polymer occurs for the moment at the surface of the solution with which the droplets have come into contact. However, the turbidity disappears or the precipitated polymer is re-dissolved by sufficiently stirring the solution, thereby eliminating the turbidity. Thereafter, when the amount of the poor solvent added dropwise reaches the limit of the solubility of the polymer, the turbidity starts to be detected in the polymer solution. The dropwise addition of the poor solvent at a low speed and performing sufficient stirring are very important in the practice of the present invention.

Accordingly, the speed of dropwise addition of the poor solvent is adjusted such that the time required from the start until the completion of the dropwise addition is from 5 minutes to 120 minutes, and more preferably from 10 minutes to 60 minutes, as a rough standard.

The turbidity can be measured, for example, by any of the methods using a turbidity meter employing a transmitted light system, a scattered light system, an integrating sphere system or a surface scattering system, such as those defined in JIS K0101 and ISO 7027.

It is possible to use a non-contact turbidity meter for use in an orbital shaking culture, as an apparatus capable of measuring the change in the turbidity while adding a solvent dropwise. The container to be used in the measurement is a glass Erlenmeyer flask or the like, which is larger than a 10-mm quartz cell used in a common spectrophotometer and thus allows for measuring the transmitted light while adding a poor solvent dropwise. Further, such a container enables to detect the turbidity of the test solution with a better sensitivity, because the length (optical path length) of a sample through which light passes is longer than 10 mm.

The opening of the Erlenmeyer flask is preferably sealed with a plug equipped with a tube for adding a poor solvent dropwise therethrough, in order to prevent the solvent from evaporating.

The measurement of the turbidity is preferably carried out at a temperature of from 10° C. to 30° C., but not particularly limited thereto. Since the solubility of the polymer varies depending on the temperature of the polymer solution, the temperature preferably does not fluctuate during the measurement, and the measurement is preferably carried out at a temperature close to room temperature at which the temperature is more likely to be stabilized. Also preferred is a method in which the temperature of the entire working environment is controlled with an air-conditioner, a method in which the measuring apparatus to be used is installed in a thermostatic chamber, or the like.

(Step (iii): Step of Calculating Amount of Solvent Added Dropwise)

Step of calculating the amount of the solvent added dropwise until the turbidity of the test solution reaches a predetermined value The insoluble or poorly-soluble components intended to be detected in the present invention are extremely trace amounts of components whose solubility is lower than that of the polymer as a main component, and are components which turn turbid with an added amount of poor solvent smaller than that at which the polymer starts to precipitate. When a state in which the turbidity of the polymer solution is visible but only a slight amount of the precipitated polymer is observed, is taken as a standard, the detection of the components is evaluated by the amount of the poor solvent added dropwise until a turbidity of from about 0.8 times to 0.1 times the standard occurs. The predetermined value of the turbidity in the present invention can be set as appropriate to a turbidity value equal to or lower than the above-described standard, for example, within such a range of turbidity value that a turbidity of from about 0.8 times to 0.1 times the standard occurs.

<Resist Polymer>

The polymer to be evaluated in the present invention is not particularly limited as long as it is a resist polymer for use in semiconductor lithography, and any conventionally known resist polymer can be used.

A chemically amplified resist polymer is a polymer whose solubility in a developer changes by the action of an acid, and which contains at least one kind of repeating unit (A) having a structure in which an alkali-soluble group is protected by an acid-dissociable dissolution-inhibiting group. The "acid-dissociable dissolution-inhibiting group" refers to a group which inhibits the dissolution of a copolymer in an alkaline developer, and which is dissociated by the action of an acid to allow the copolymer to dissolve in the alkaline developer. Further, there are cases where the resist polymer contains a repeating unit (B) having a lactone ring structure, a repeating unit (C) having a hydroxy group and/or the like, in order to improve the adhesion of the polymer to a substrate. If necessary, the resist polymer can further contain another repeating unit, such as a repeating unit (D) having a structure (hereinafter, sometimes referred to as "acid-stable dissolution-inhibiting structure") which inhibits the dissolution of the polymer in an alkaline developer, and which is stable to the action of an acid.

(Repeating Unit (A))

The repeating unit (A) is a repeating unit having a structure in which an alkali-soluble group, such as a carboxyl group, a phenolic hydroxyl group or a sulfonic acid group, is protected by an acid-dissociable dissolution-inhibiting group which is dissociated by the action of an acid. The repeating unit (A) is preferably a repeating unit in which the OH group of the carboxyl group or the phenolic hydroxyl group in a repeating unit derived from (meth)acrylic acid, hydroxystyrene or the like, or the OH group of the sulfonic acid group or the like, is protected by an acid-dissociable dissolution-inhibiting group.

The acid-dissociable dissolution-inhibiting group can have, for example, a structure represented by the formula (a1) or (a2).

[Chem 1]

(a1)

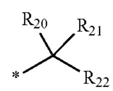

In the formula (a1), * represents the binding site of the structure represented by the formula (a1); and each of $R_{20}$ and $R_{21}$ independently represents a hydrocarbon group having from 1 to 4 carbon atoms. Specifically, each of $R_{20}$ and $R_{21}$ may be, for example, an alkyl group having from 1 to 4 carbon atoms, such as a methyl group, an ethyl group, an n-propyl group, an i-propyl group, an n-butyl group or an i-butyl group. $R_{22}$ represents a hydrocarbon group having from 1 to 12 carbon atoms. Specifically, $R_{22}$ may be, for example: a linear, branched or cyclic alkyl group having from 1 to 12 carbon atoms, such as a methyl group, an ethyl group, an n-propyl group, an i-propyl group, an n-butyl group, an i-butyl group, a cyclopentyl group, a cyclohexyl group, a norbornyl group, a tricyclo[5.2.1.02,6]decanyl group, an adamantyl group or a tetracyclo[4.4.0.12,5.17,10]dodecanyl group; or an aryl group having from 6 to 12 carbon atoms, such as a phenyl group or a naphthyl group. $R_{22}$ may be bound to $R_{20}$ or $R_{21}$ to form a ring, specifically, an alicyclic ring having from 5 to 12 carbon atoms, such as a cyclopentane ring, a cyclohexane ring, a norbornane ring, a tricyclo[5.2.1.02,6]decane ring, an adamantane ring or a tetracyclo[4.4.0.12,5.17,10]dodecane ring. In particular, when $R_{22}$ contains, or $R_{22}$ is bound to $R_{20}$ or $R_{21}$ to form, a saturated alicyclic ring, specifically, a cyclopentane ring, a cyclohexane ring, a norbornane ring, a tricyclo[5.2.1.02,6]decane ring, an adamantane ring, a tetracyclo[4.4.0.12,5.17,10]dodecane ring or the like, the difference in solubility in an alkaline developer before and after lithography is increased, making it preferable for drawing a fine pattern.

[Chem 2]

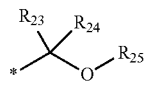

(a2)

In the formula (a2), * represents the binding site of the structure represented by the formula (a2); and each of $R_{23}$ and $R_{24}$ independently represents a hydrogen atom or a hydrocarbon group having from 1 to 4 carbon atoms. Specifically, each of $R_{23}$ and $R_{24}$ may be, for example: a hydrogen atom; or an alkyl group having from 1 to 4 carbon atoms, such as a methyl group, an ethyl group, an n-propyl group, an i-propyl group, an n-butyl group or an i-butyl group. $R_{25}$ represents a hydrocarbon group having from 1 to 12 carbon atoms. Specifically, $R_{25}$ may be, for example, a linear, branched or cyclic alkyl group having from 1 to 12 carbon atoms, such as a methyl group, an ethyl group, an n-propyl group, an i-propyl group, an n-butyl group, an i-butyl group, a t-butyl group, a 2-ethylhexyl group, a cyclopentyl group, a cyclohexyl group, a norbornyl group, a tricyclo[5.2.1.02,6]decanyl group, an adamantyl group or a tetracyclo[4.4.0.12,5.17,10]dodecanyl group. $R_{23}$ may be bound to $R_{24}$ or $R_{25}$ to form a ring. Specific examples of the ring to be formed when $R_{23}$ is bound to $R_{24}$ include a cyclopentane ring, a cyclohexane ring, a norbornane ring, a tricyclo[5.2.1.02,6]decane ring, an adamantane ring and a tetracyclo[4.4.0.12,5.17,10]dodecane ring; and specific examples of the ring to be formed when $R_{23}$ is bound to $R_{25}$ include a hydrofuran ring and a hydropyran ring.

Specific examples of the repeating unit (A) will be shown below, but the present invention is not limited to following examples. It is possible to select and use one kind of unit, or a plurality of kinds of units having different structures, from the repeating units (A) shown below.

[Chem 3]

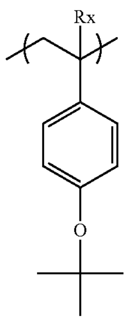

(A101)

-continued

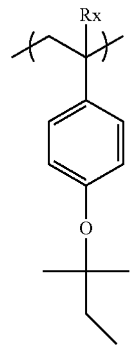

(A102)

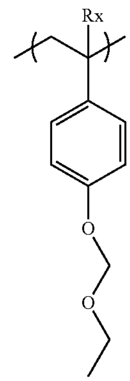

(A103)

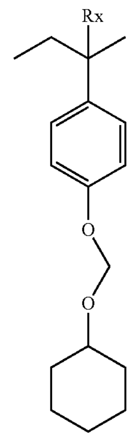

(A104)

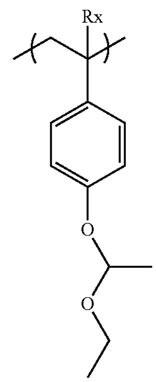

(A105)

-continued
(A106)
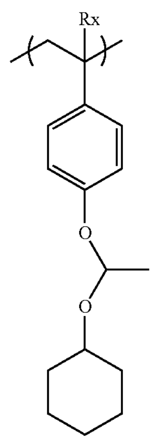
(A107)
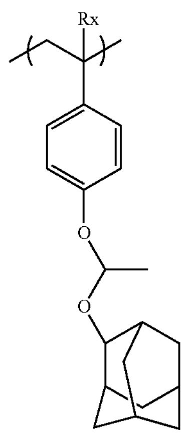
(A201)
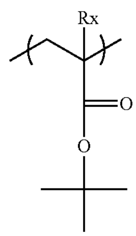
(A202)
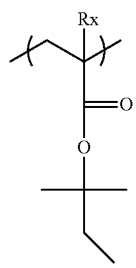
(A203)
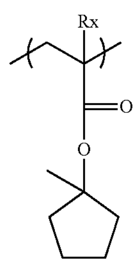
-continued
(A204)
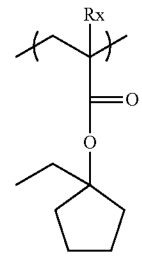
(A205)
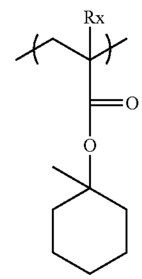
(A206)
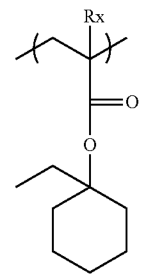
(A207)
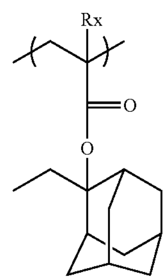
(A208)
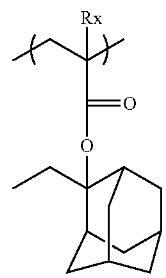
(A209)
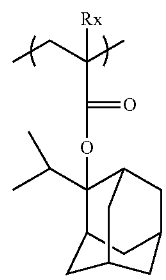

-continued
(A210)
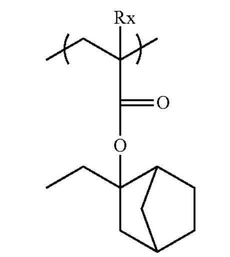
(A211)
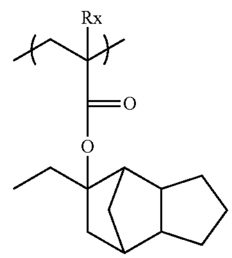
(A212)
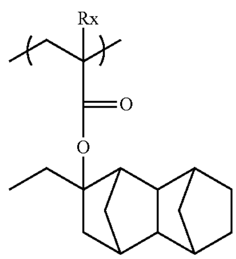
(A213)
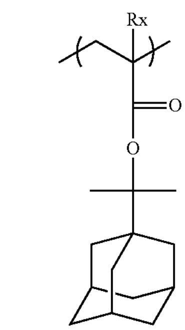
(A214)
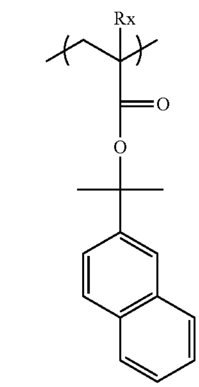
(In each formula, $R_x$ represents H, $CH_3$ or $CF_3$.)
[Chem 4]
(A301)
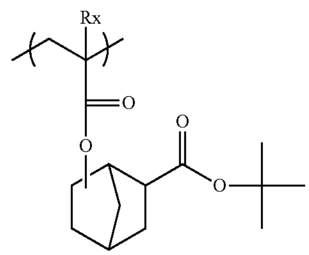
(A302)
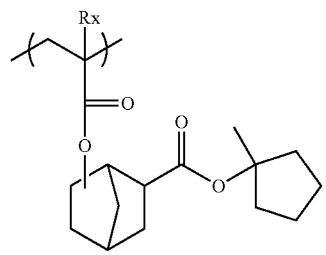
(A303)
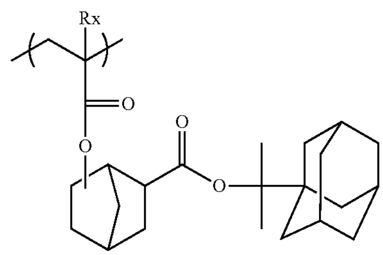
(A304)
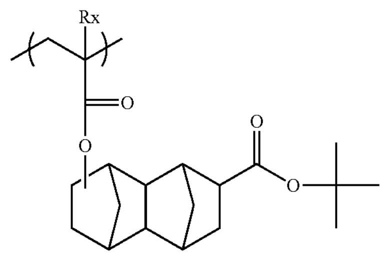
(A305)
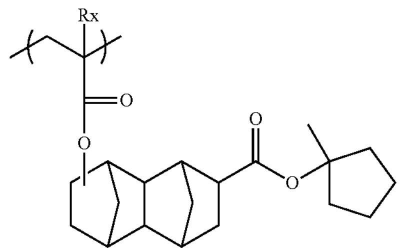
(A306)
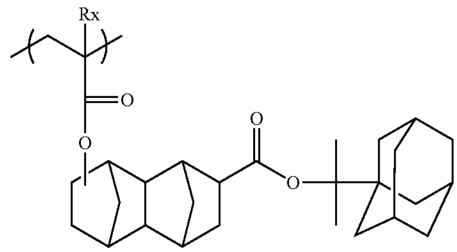

-continued
(A401)
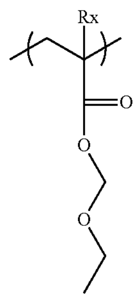
(A402)
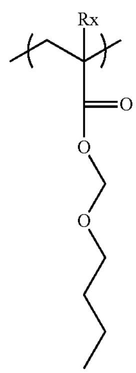
(A403)
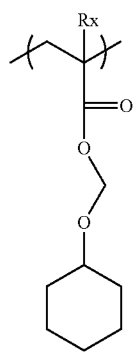
(A404)
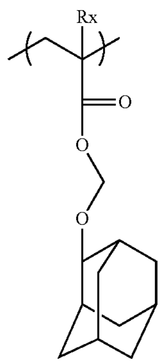
-continued
(A405)
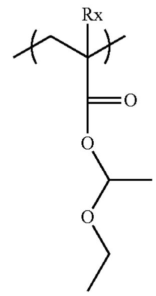
(A406)
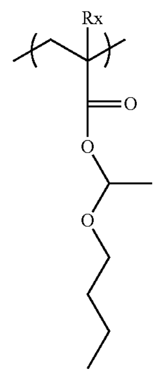
(A407)
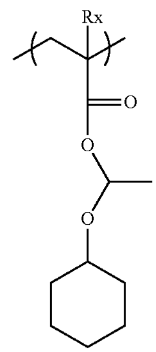
(A408)
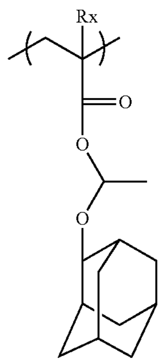
(A409)
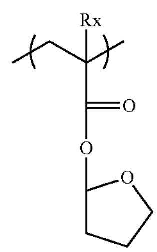

-continued (A410)

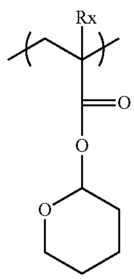

(A411)

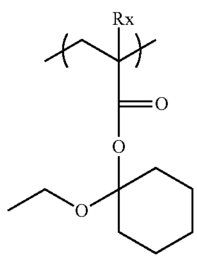

(A412)

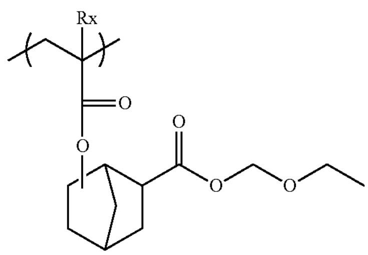

(A413)

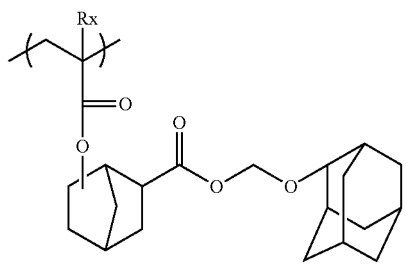

(A414)

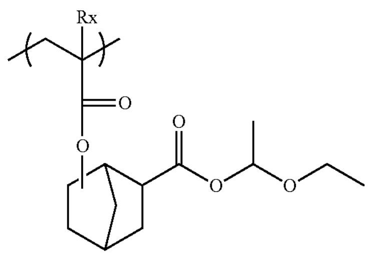

(A415)

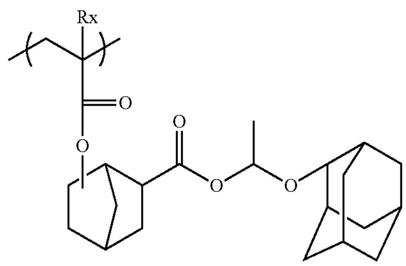

-continued (A416)

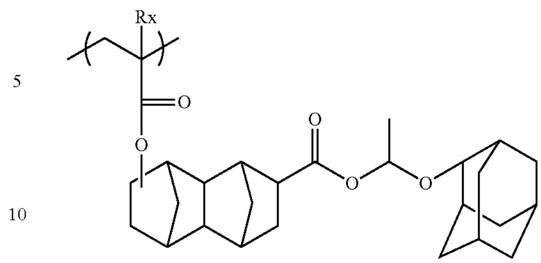

(In each formula, $R_x$ represents H, $CH_3$ or $CF_3$.)

(Repeating Unit (B))

The repeating unit (B) is a repeating unit having a lactone structure or a sultone structure, and gives the ability to increase the adhesion of the resulting polymer to a substrate or a base film, or to control the solubility of the polymer in a lithography solvent or an alkaline developer. The repeating unit (B) may preferably have, for example, a structure represented by the formula (B1) below.

[Chem 5]

(B1)

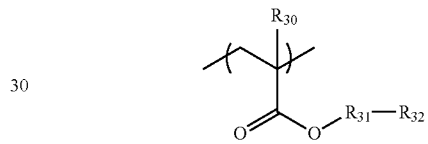

In the formula (B1), $R_{30}$ represents a hydrogen atom, or a hydrocarbon group having from 1 to 4 carbon atoms and optionally substituted with a fluorine atom. Specifically, $R_{30}$ may be, for example: a hydrogen atom; or an alkyl group having from 1 to 4 carbon atoms, such as a methyl group, an ethyl group, an n-propyl group, an i-propyl group, an n-butyl group, an i-butyl group or a trifluoromethyl group. $R_{30}$ is preferably a hydrogen atom, a methyl group or a trifluoromethyl group. $R_{31}$ represents a single bond or a divalent linking group. The "divalent linking group" refers to an alkylene group having from 1 to 4 carbon atoms, or the alkylene group substituted with an oxygen atom, a carbonyl group or a carbonyloxy group. $R_{32}$ represents a lactone structure-containing group represented by the formula (b) below.

[Chem 6]

(b)

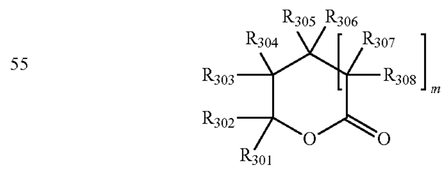

In the formula (b), any one of $R_{301}$ to $R_{308}$ represents a single bond which is the binding site of the group represented by $R_{32}$; and each of the remaining $R_{301}$ to $R_{308}$ represents a hydrogen atom, or a hydrocarbon group or an alkoxy group having from 1 to 4 carbon atoms. Alternatively, any one of $R_{301}$ to $R_{308}$ represents a hydrocarbon group having from 3 to 14 carbon atoms and optionally containing an oxygen atom or a sulfur atom, which has a binding site of the group represented by $R_{32}$ and which binds to any one or two of the other $R_{301}$ to $R_{308}$ to form an alicyclic ring having from 5 to 15 carbon atoms; any one or two of the remaining $R_{301}$ to $R_{308}$ each represent a single bond for forming the above-mentioned alicyclic ring having from 5 to 15 carbon atoms; and each of the other remaining $R_{301}$ to $R_{308}$ represents a hydrogen atom, or a hydrocarbon group or an alkoxy group having from 1 to 4 carbon atoms. m represents an integer of 0 or 1.

Specific examples of the alicyclic ring described above include a cyclopentane ring, a cyclohexane ring, a norbornane ring, a 7-oxa-norbornane ring, a 7-thia-norbornane ring and a tetracyclo[4.4.0.12,5.17,10]dodecane ring, and preferred examples thereof include a norbornane ring and a 7-oxa-norbornane ring. Specific examples of the hydrocarbon group having from 1 to 4 carbon atoms include a methyl group, an ethyl group, an n-propyl group, an i-propyl group, an n-butyl group and an i-butyl group. Specific examples of the alkoxy group having from 1 to 4 carbon atoms include a methoxy group and an ethoxy group.

Particularly preferred examples of the lactone structure in which, in the formula (b): any one of $R_{301}$ to $R_{308}$ represents a single bond which has the binding site of the group represented by $R_{32}$; and each of the remaining $R_{301}$ to $R_{308}$ represents a hydrogen atom, or a hydrocarbon group or an alkoxy group having from 1 to 4 carbon atoms; include γ-butyrolactone structures and δ-valerolactone structures. Particularly preferred example of the lactone structure in which: any one of $R_{301}$ to $R_{308}$ represents a hydrocarbon group having from 3 to 14 carbon atoms and optionally containing an oxygen atom or a sulfur atom, which has a binding site of the group represented by $R_{32}$ and which binds to any one or two of the other $R_{301}$ to $R_{308}$ to form an alicyclic ring having from 5 to 15 carbon atoms; and each of the remaining $R_{301}$ to $R_{308}$ represents a hydrogen atom, or a hydrocarbon group or an alkoxy group having from 1 to 4 carbon atoms; include: 1,3-cyclohexanecarbolactone structures, 2,6-norbornanecarbolactone structures, 7-oxa-2,6-norbornanecarbolactone structures and 4-oxa-tricyclo [5.2.1.02,6]decan-3-one structures.

Specific examples of the repeating unit (B) will be shown below, but the present invention is not limited to following examples. It is possible to select and use one kind of unit, or a plurality of kinds of units having different structures, from the repeating units (B) shown below.

[Chem 7]

(B101)

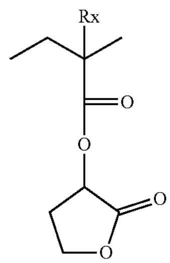

-continued (B102)

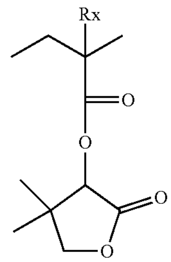

(B103)

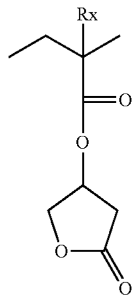

(B104)

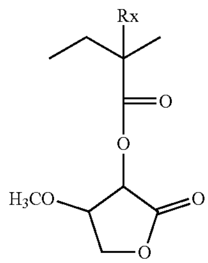

(B105)

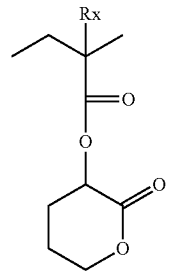

(B106)

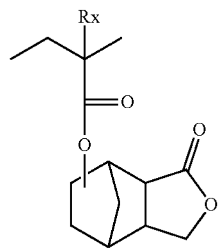

-continued
(B107)
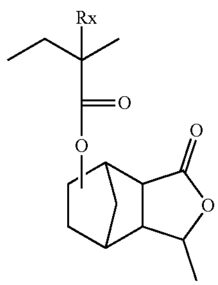
(B108)
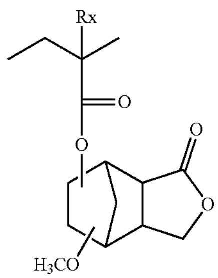
(B109)
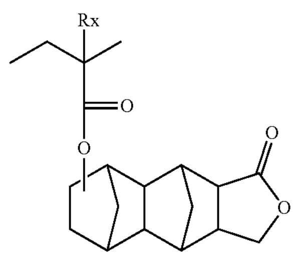
(B110)
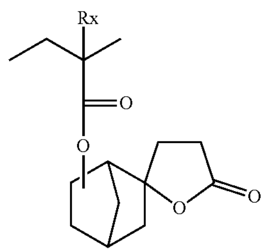
(B111)
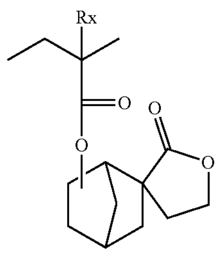
(B112)
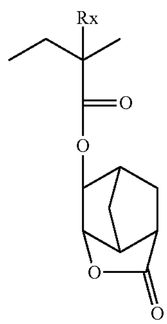
-continued
(B113)
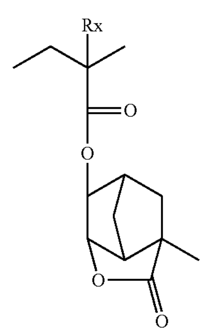
(B114)
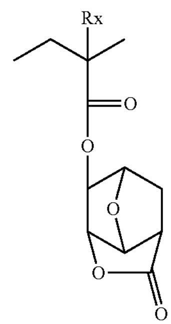
(B115)
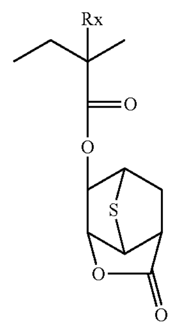
(B116)
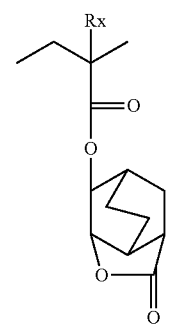
(B117)
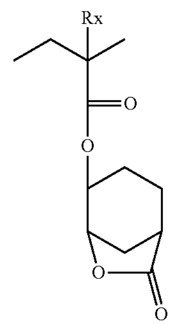

-continued
(B118)
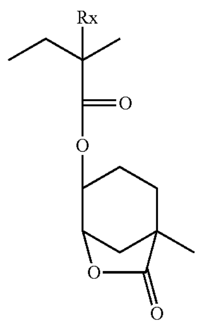
(B119)
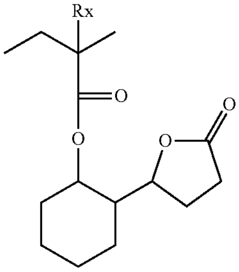
(B201)
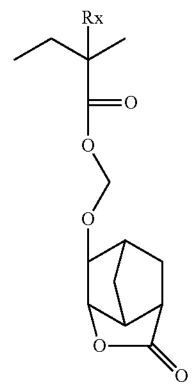
(B202)
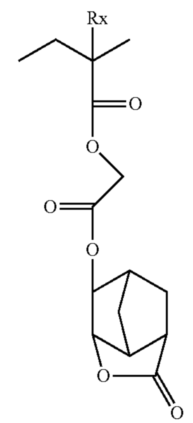
-continued
(B301)
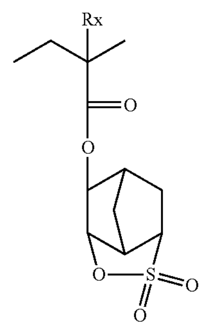
(B302)
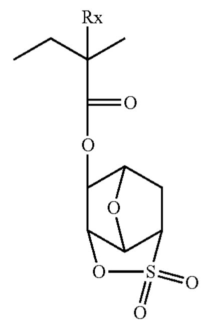
(B303)
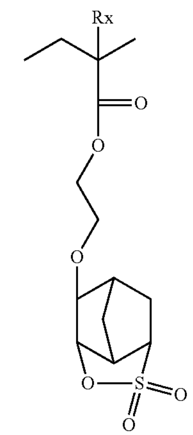
(B304)
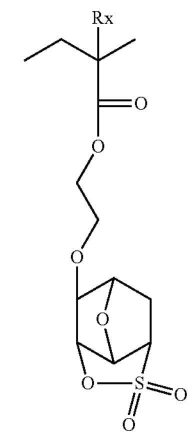

-continued (B305)

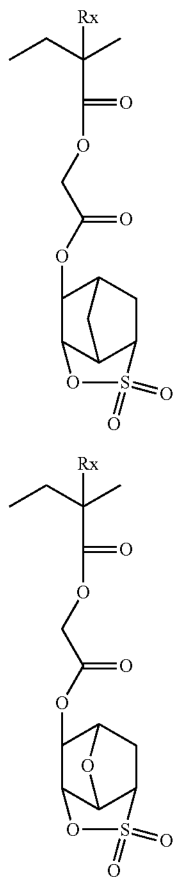

(B306)

(In each formula, $R_x$ represents H, $CH_3$ or $CF_3$.)

(Repeating Unit (C))

The repeating unit (C) is a repeating unit having a hydroxy group or a carboxy group in a side chain, and gives the ability to increase the adhesion of the resulting polymer to a substrate or a base film, to control the solubility of the polymer in a lithography solvent or an alkaline developer, or to form a cross-linked structure by reacting with a curing agent.

The repeating unit (C) particularly preferably has a structure represented by any one of the formulae (C1) to (C3).

[Chem 8]

(C1)

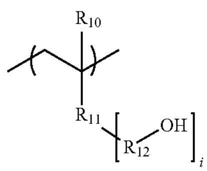

In the formula (C1), $R_{10}$ represents a hydrogen atom, or a hydrocarbon group having from 1 to 4 carbon atoms and optionally substituted with a fluorine atom. Specifically, $R_{10}$ may be, for example: a hydrogen atom; or an alkyl group having from 1 to 4 carbon atoms and optionally substituted with a fluorine atom, such as a methyl group, an ethyl group, an n-propyl group, an i-propyl group, an n-butyl group, an i-butyl group or a trifluoromethyl group. $R_{10}$ is preferably a hydrogen atom, a methyl group or a trifluoromethyl group. $R_{11}$ represents a substituted or non-substituted aromatic hydrocarbon group. $R_{12}$ represents a single bond, a divalent hydrocarbon group having from 1 to 4 carbon atoms and optionally substituted with a fluorine atom, or a carbonyl group. Specifically, $R_{12}$ may be, for example: a single bond; or an alkylene group having from 1 to 4 carbon atoms and optionally substituted with a fluorine atom, such as a methylene group, a 1,1-ethylene group, a 2,2-propylene group, a 1,1,1,3,3,3-hexafluoro-2,2-propylene group or a 1,1,1-trifluoro-2-trifluoromethyl-2,3-propylene group. $R_{12}$ is preferably a single bond, a 1,1,1,3,3,3-hexafluoro-2,2-propylene group or a 1,1,1-trifluoro-2-trifluoromethyl-2,3-propylene group, and particularly preferably a single bond. i represents an integer of 1 or 2.

[Chem 9]

(C2)

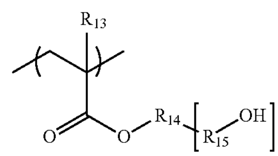

In the formula (C2), $R_{13}$ represents a hydrogen atom, or a hydrocarbon group having from 1 to 4 carbon atoms and optionally substituted with a fluorine atom. Specifically, $R_{13}$ may be, for example: a hydrogen atom; or an alkyl group having from 1 to 4 carbon atoms and optionally substituted with a fluorine atom, such as a methyl group, an ethyl group, an n-propyl group, an i-propyl group, an n-butyl group, an i-butyl group or a trifluoromethyl group. $R_{13}$ is preferably a hydrogen atom, a methyl group or a trifluoromethyl group. $R_{14}$ represents a divalent to tetravalent hydrocarbon group having from 2 to 14 carbon atoms and optionally containing a fluorine atom, an oxygen atom or a sulfur atom. Specifically, $R_{14}$ may be, for example: a linear or branched saturated hydrocarbon group having from 2 to 4 carbon atoms, such as an ethylene group or an isopropylene group; or a saturated alicyclic hydrocarbon group having from 5 to 14 carbon atoms and optionally containing an oxygen atom or a sulfur atom, which has a cyclohexane ring, a norbornane ring, a 7-oxa-norbornane ring, a 7-thia-norbornane ring, a adamantane ring, a tetracyclo[4.4.0.12,5.17,10]dodecane ring or the like. $R_{14}$ is preferably a cyclohexane ring, a norbornane ring or an adamantane ring. $R_{15}$ represents a single bond, or a divalent hydrocarbon group having from 1 to 4 carbon atoms and optionally substituted with a fluorine atom. Specifically, $R_{15}$ may be, for example: a single bond; or an alkylene group having from 1 to 4 carbon atoms and optionally substituted with a fluorine atom, such as a methylene group, a 1,1-ethylene group, a 2,2-propylene group, a 1,1,1,3,3,3-hexafluoro-2,2-propylene group or a 1,1,1-trifluoro-2-trifluoromethyl-2,3-propylene group. $R_{15}$ is preferably a single bond, a 1,1,1,3,3,3-hexafluoro-2,2-propylene group or a 1,1,1-trifluoro-2-trifluoromethyl-2,3-propylene group. The combination in which $R_{14}$ is an adamantyl group and $R_{15}$ is a single bond is particularly preferred. j represents an integer from 1 to 3.

[Chem 10]

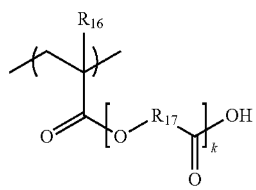

(C3)

In the formula (C3), $R_{16}$ represents a hydrogen atom, or a hydrocarbon group having from 1 to 4 carbon atoms and optionally substituted with a fluorine atom. Specifically, $R_{16}$ may be, for example: a hydrogen atom; or an alkyl group having from 1 to 4 carbon atoms and optionally substituted with a fluorine atom, such as a methyl group, an ethyl group, an n-propyl group, an i-propyl group, an n-butyl group, an i-butyl group or a trifluoromethyl group. $R_{16}$ is preferably a hydrogen atom, a methyl group or a trifluoromethyl group. $R_{17}$ represents a divalent alicyclic hydrocarbon group having from 6 to 12 carbon atoms and optionally containing an oxygen atom or a sulfur atom. Specifically, $R_{17}$ may be, for example, an alicyclic hydrocarbon group optionally containing an oxygen atom or a sulfur atom, which has a norbornane ring, a 7-oxa-norbornane ring, a 7-thia-norbornane ring, a tetracyclo[4.4.0.12,5.17,10]dodecane ring or the like. $R_{17}$ is preferably a norbornane ring or a tetracyclo[4.4.0.12,5.17,10]dodecane ring. k represents an integer of 0 or 1.

Specific examples of the repeating unit (C) will be shown below, but the present invention is not limited to following examples. It is possible to select and use one kind of unit, or a plurality of kinds of units having different structures, from the repeating units (C) shown below.

[Chem 11]

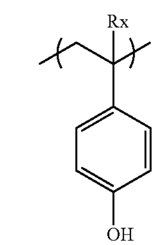

(C101)

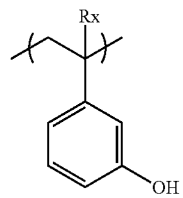

(C102)

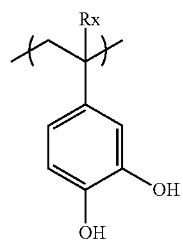

(C103)

-continued

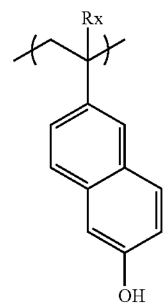

(C104)

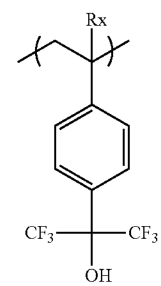

(C105)

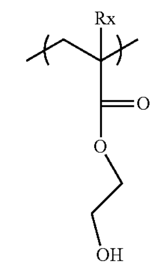

(C201)

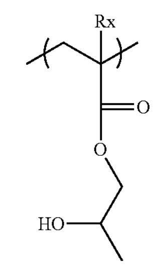

(C202)

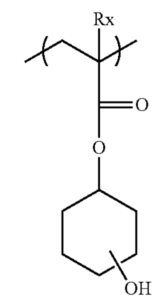

(C203)

-continued
(C204)
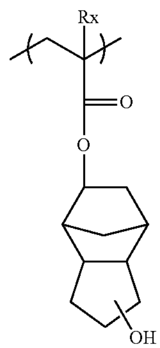
(C205)
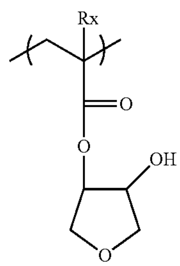
(C206)
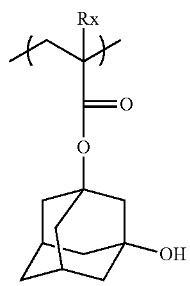
(C207)
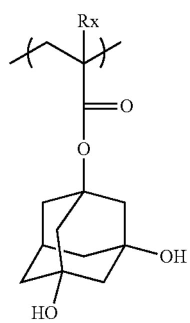
(C208)
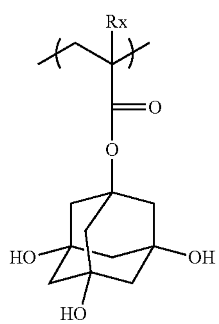
-continued
(C209)
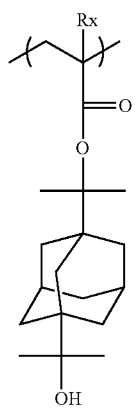
(C210)
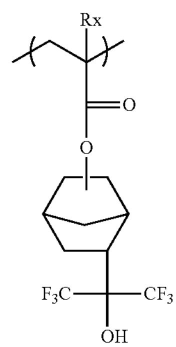
(C211)
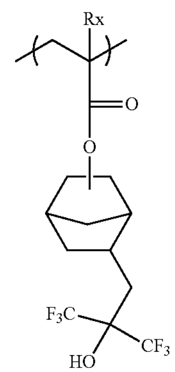
(C301)
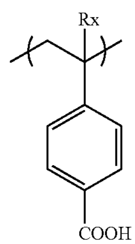
(C302)
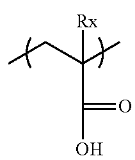

-continued (C303)

(C304)

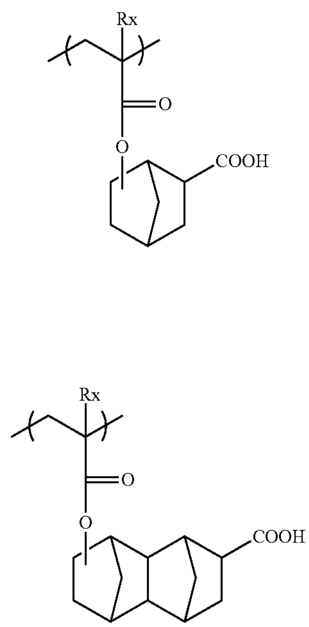

(In each formula, $R_x$ represents H, $CH_3$ or $CF_3$.)

(Repeating Unit (D))

The repeating unit (D) is a repeating unit having a structure in which an alkali-soluble group such as a carboxyl group or a phenolic hydroxyl group is protected by an acid-stable dissolution-inhibiting group which is not dissociated even by the action of an acid. The repeating unit (D) is preferably a repeating unit in which the carboxyl group or the phenolic hydroxyl group in a repeating unit derived from (meth)acrylic acid, hydroxystyrene or the like, is protected by an acid-stable dissolution-inhibiting group. The repeating unit D gives the ability to control the solubility of the resulting polymer in a lithography solvent or an alkaline developer, the optical properties such as the refractive index and light transmittance of the resulting thin film, and the like.

The acid-stable dissolution-inhibiting group may be, for example: an aliphatic hydrocarbon group having from 1 to 12 carbon atoms in which the carbon that substitutes the hydrogen atom of the carboxyl group or the phenolic hydroxyl group and binds to the oxygen atom is a primary or secondary carbon; an aromatic hydrocarbon group; or a structure to which a methyl group and 1-adamantyl group are bound. Specifically, the acid-stable dissolution-inhibiting group may be, for example, a methyl group, an ethyl group, an n-propyl group, an i-propyl group, an n-butyl group, an i-butyl group, a cyclopentyl group, a cyclohexyl group, a 2-norbornyl group, a 2-isobornyl group, a 8-tricyclo [5.2.1.02,6]decanyl group, a 1-adamantyl group, a 2-adamantyl group, a 4-tetracyclo[4.4.0.12,5.17,10]dodecanyl group, a phenyl group, a benzyl group, a naphthyl group or an anthracenyl group.

Specific examples of the repeating unit (D) will be shown below, but the present invention is not limited to following examples. It is possible to select and use one kind of unit, or a plurality of kinds of units having different structures, from the repeating units (D) shown below.

[Chem 12]

(D101)

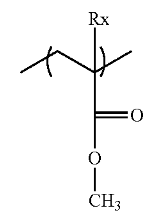

(D102)

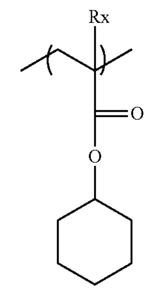

(D103)

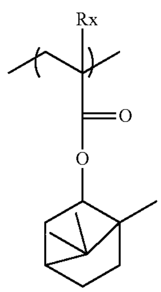

(D104)

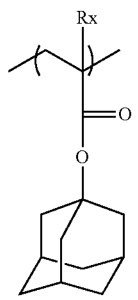

(D105)

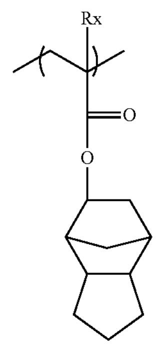

-continued (D106)

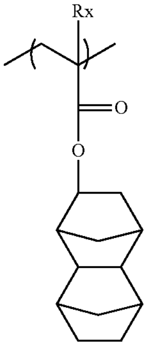

(D107)

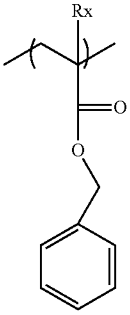

(D108)

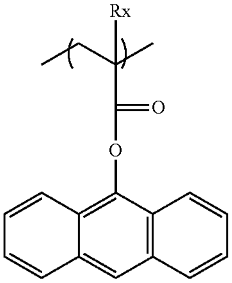

(D109)

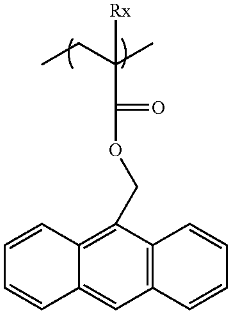

(In each formula, $R_x$ represents H, $CH_3$ or $CF_3$.)

Further, examples of a repeating unit which has the same effect as the repeating unit (D) include a repeating unit represented by the formula (D').

[Chem 13]

(D')

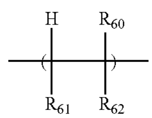

In the formula (D'), $R_{60}$ represents a hydrogen atom, or a hydrocarbon group having from 1 to 4 carbon atoms and optionally substituted with a fluorine atom. Specifically, $R_{60}$ may be, for example: a hydrogen atom; or an alkyl group having from 1 to 4 carbon atoms and optionally substituted with a fluorine atom, such as a methyl group, an ethyl group, an n-propyl group, an i-propyl group, an n-butyl group, an i-butyl group or a trifluoromethyl group. $R_{60}$ is preferably a hydrogen atom, a methyl group or a trifluoromethyl group. $R_{61}$ represents a hydrogen atom, a single bond which binds to $R_{62}$, or an alkylene group having from 1 to 4 carbon atoms. Specifically, $R_{61}$ may be, for example, a hydrogen atom, a single bond, a methylene group, an ethylene group or an isopropylene group. $R_{62}$ represents an aromatic hydrocarbon group having from 6 to 14 carbon atoms. Specifically, $R_{62}$ may be, for example, a benzene ring, a naphthalene ring or an anthracene ring.

Specific examples of the repeating unit (D') are shown below.

[Chem 14]

(D'101)

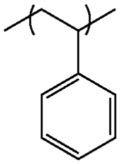

(D'102)

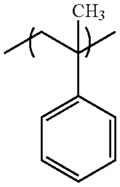

(D'203)

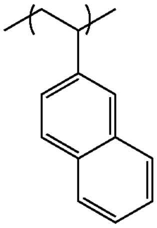

(D'204)

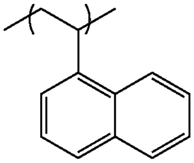

(D'205)

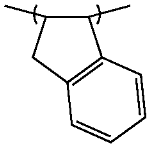

-continued (D'206)

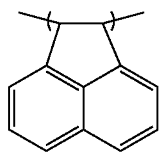

<Method for Producing Resist Polymer>

The method for producing a resist polymer according to the present invention includes: the step of obtaining the resist polymer; and the step of evaluating the dissolution properties of the resulting resist polymer, using the above-described method for evaluating a resist polymer. The method for producing a resist polymer according to the present invention preferably further includes the step of purifying the resist polymer before the evaluation step.

(Step of Obtaining Resist Polymer)

In the present invention, the resist polymer to be evaluated can be obtained by polymerizing monomers by a conventionally known polymerization method such as radical polymerization, cation polymerization or anion polymerization. Further, the resist polymer is preferably a polymer produced by any of various kinds of already-known methods for producing a resist polymer in which the amount of insoluble or poorly-soluble components is low.

(Purification Step of Resist Polymer)

Examples of the purification to be performed in the purification step of the resist polymer include purification by reprecipitation, extraction, solvent displacement and filtration using a filter, which are performed for the purpose of removing the insoluble or poorly-soluble components.

Examples

Embodiments of the present invention will now be described in detail, with reference to Examples. However, the present invention is in no way limited to these Examples. In the following Examples, the term "part(s)" is based on mass unless otherwise specified.

The analyses of the polymer produced in the present Examples were carried out as follows.

[Weight Average Molecular Weight and Molecular Weight Distribution of Polymer]

The weight average molecular weight and the molecular weight distribution of the polymer were measured by GPC (gel permeation chromatography), using polystyrene as a standard.

Measuring apparatus: HLC-8220 GPC, manufactured by Tosoh Corporation

Detector: differential refractive index (RI) detector

Columns: Shodex GPC KF804×three columns (manufactured by Showa Denko K.K.)

Eluent: tetrahydrofuran

Flow rate: 1.0 mL/min

Temperature: 40° C.

Calibration curve: prepared using a polystyrene standard sample (manufactured by Tosoh Corporation)

[Quantification of Low Molecular Weight Components in Polymer]

The quantification of low molecular weight components contained in the polymer synthesized as described below was performed by LC (liquid chromatography) analysis.

Measuring apparatus: HLC-8320 GPC, manufactured by Tosoh Corporation

Detector: differential refractive index (RI) detector

Columns: TOSOH TSKgel super HZ1000×four columns

Eluent: tetrahydrofuran

Flow rate: 0.35 mL/min

Temperature: 40° C.

[Monomer Composition Ratio in Polymer]

The monomer composition ratio in the polymer synthesized as described below was analyzed by $^{13}C$-NMR.

Apparatus: AV400, manufactured by Bruker Corporation

Deuterated solvent: acetone-d6

Relaxation reagent: chromium (III) acetylacetonate

Measurement temperature: 40° C.

Abbreviations of the compounds used in the following experiments are as shown below.

PACS: p-acetoxy styrene

4-HS: 4-hydroxystyrene

MCpMA: 1-methyl-1-cyclopentyl methacrylate

EChMA: 1-ethyl-1-cyclohexyl methacrylate

ANSM: 2-methacryloyloxyacetoxy-4,5-oxathiatricyclo[4.2.1.$0^{3,7}$]nonane=5,5-dioxide MEK: 2-butanone MTBE: methyl tertiary-butyl ether PGMEA: propylene glycol monomethyl ether acetate PGME: propylene glycol monomethyl ether

[Reference Example 1] Production of 4-HS/MEK Solution

Into a 100-L glass-lined reaction vessel equipped with a thermometer, a cooling tube and a stirrer, 7.9 kg of PACS and 23.4 kg of methanol were introduced, and the reaction vessel was sealed with nitrogen. The contents of the reaction vessel were cooled with stirring, to achieve a liquid temperature of −5° C. Thereafter, the operation of depressurizing the interior of the reaction vessel, followed by re-pressurization with nitrogen, was repeated three times. In a container separate from the reaction vessel, a 3 M aqueous solution of sodium hydroxide was prepared in an amount equimolar to the amount of PACS, and the aqueous solution was bubbled with nitrogen for one hour. The aqueous solution of sodium hydroxide which had been bubbled with nitrogen was added dropwise into the reaction vessel over 100 minutes, and stirring was continued for another 30 minutes, to carry out the reaction to deprotect PACS and to convert it to 4-HS.

Subsequently, 0.97 molar equivalent of 6 M hydrochloric acid with respect to the PACS used was added dropwise into the reaction vessel over 60 minutes, and stirring was continued for another 30 minutes after the completion of the dropwise addition, to neutralize the reaction solution. In the above procedure, 6 M hydrochloric acid which had been bubbled with nitrogen for one hour, in advance, was used for the dropwise addition.

The neutralized reaction solution was then heated to a temperature of from 10 to 20° C., and 23.7 kg of MTBE was added thereto. The resulting mixture was stirred for 15 minutes, left to stand for 15 minutes, and the aqueous layer was drained. Subsequently, 23.7 kg of ion exchanged water was introduced into the reaction vessel, and the resulting mixture was stirred for 15 minutes, left to stand for 15 minutes, and then the aqueous layer was drained. Thereafter, 19.8 kg of MTBE and 23.7 kg of ion exchanged water were introduced into the reaction vessel, and the resulting mixture was stirred for 15 minutes, then left to stand for 15 minutes, and the aqueous layer was drained. Finally, the operation of introducing 23.7 kg of ion exchanged water into the reaction vessel, stirring the resulting mixture for 15 minutes, then allowing the mixture to stand for 15 minutes and draining the aqueous layer, was repeated twice.

The organic layer after washing with water was transferred to a separate 100-L reaction vessel. While performing distillation under reduced pressure at 5 kPa and at 5° C. or lower, MEK was introduced into the reaction vessel in divided amounts over multiple times, and organic impurities other than 4-HS, such as MTBE and reaction side products, as well as excessive MEK, were removed by distillation. Finally, a MEK solution having a 4-HS concentration of 25% by mass was obtained. Thereafter, the thus obtained solution was passed through a hollow fiber membrane filter made of polytetrafluoroethylene (PTFE) and having a pore diameter of 50 nm, to obtain 21 kg of a 25.4% by mass 4-HS/MEK solution.

The resulting 4-HS/MEK solution was analyzed by gel permeation chromatography (GPC), and as a result, the chromatogram area of 4-HS with respect to 100% of the chromatogram area of the components other than MEK as a solvent, was 99.9%.

[Example 1] Production of 4-HS/MCpMA Copolymer

A quantity of 320.0 g of the 25.4% by mass 4-HS/MEK solution (the chromatogram area of 4-HS with respect to 100% of the total chromatogram area of the components other than MEK was 99.9%, in GPC analysis) obtained in Reference Example 1, 182.4 g of MCpMA, 33.6 g of dimethyl 2,2-azobisisobutyrate and 52.0 g of MEK were introduced into a container, followed by mixing, to prepare a monomer solution.

Into a 2-L four-necked flask reactor made of glass and equipped with a stirrer, a cooling device and a thermometer, 211.0 g of MEK was introduced, and a nitrogen atmosphere was created in the reactor, followed by heating to 79° C. The monomer solution prepared above was added dropwise to the reactor at a constant rate over 4 hours, and then the reaction was allowed to continue for another 2 hours. The temperature during the polymerization reaction was controlled within the range of from 79.0 to 80.5° C., and then lowered to room temperature after the completion of the polymerization. The resulting polymerization solution was mixed with 1,840 g of n-hexane, the mixture was stirred to allow the polymer to precipitate, left to stand, and then the polymer was separated by decantation. The operation of redissolving the resulting polymer in a mixed liquid containing 160 g of acetone and 120 g of 2-propanol, adding 1,840 g of n-hexane thereto, stirring the resulting mixture to allow the polymer to precipitate and separating the polymer by decantation, was repeated four times.

The recovered polymer was dissolved in 560 g of ethyl acetate. A part of the polymer solution was sampled, dried under reduced pressure at 40° C. to obtain a powder of the polymer, and the powder was subjected to an NMR analysis. The monomer composition ratio (molar ratio) in the polymer as determined by the NMR analysis was 4-HS: MCpMA=40.3:59.7.

The remaining polymer solution was washed with a 1% by mass aqueous solution of oxalic acid using a separatory funnel, and then washed five times with pure water. The polymer solution after washing was distilled while adding PGMEA, and while removing ethyl acetate by distillation under reduced pressure and at a heat source temperature of 45° C. Finally, a PGMEA solution of 4-HS/MCpMA copolymer having a polymer concentration of 15% by mass was obtained.

As a result of analyzing the resulting polymer solution by GPC and LC, Mw was 5,810, the ratio Mw/Mn was 1.39, and the amount of residual low molecular weight components having an Mw of less than 200 was 0.00 (LC area %).

[Example 2] Production of 4-HS/MCpMA Copolymer

The same procedure as in Example 1 was repeated except for using a 25% by mass 4-HS/MEK solution (the chromatogram area of 4-HS with respect to 100% of the total chromatogram area of the components other than MEK was 97.3%, in GPC analysis), to obtain a PGMEA solution of 4-HS/MCpMA copolymer having a polymer concentration of 15% by mass.

As a result of analyzing the resulting polymer, the ratio 4-HS:MCpMA was 40.4:59.6, Mw was 5,860, the ratio Mw/Mn was 1.40, the amount of residual low molecular weight components having an Mw of less than 200 was 0.00 (LC area %). These physical properties were almost the same as those of the polymer obtained in Example 1.

[Example 3] ANSM/EChMA

A quantity of 243 g of ANSM, 200 g of EChMA, 25.2 g of dimethyl 2,2-azobisisobutyrate, 0.2 g of triethylamine and 756 g of MEK were introduced into a container, followed by mixing, to prepare a monomer solution.

Into a 2-L four-necked flask reactor made of glass and equipped with a stirrer, a cooling device and a thermometer, 305 g of MEK was introduced, and a nitrogen atmosphere was created in the reactor, followed by heating to 79° C. The monomer solution prepared above was added dropwise to the reactor at a constant rate over 3 hours, and then the reaction was allowed to continue for another 2 hours. The temperature during the polymerization reaction was controlled within the range of from 79.0 to 81.0° C., and then lowered to room temperature after the completion of the polymerization.

The resulting polymerization solution was mixed with 5,400 g of n-hexane and 600 g of isopropanol, the mixture was stirred to allow the polymer to precipitate, and then a wet powder of the polymer was separated by filtration. The operation of dispersing the wet powder of the polymer in a mixed liquid of 4,280 g of methanol and 230 g of MEK to perform slurry washing, and separating the wet powder of the polymer by filtration, was repeated three times.

The recovered wet powder of the polymer was dissolved in 800 g of MEK. A part of the polymer solution was sampled, dried under reduced pressure at 30° C. to obtain a powder of the polymer, and the powder was subjected to an NMR analysis. The monomer composition ratio (molar ratio) in the polymer as determined by the NMR analysis was ANSM:EChMA=51.4:48.6.

The polymer solution after washing was distilled while adding PGMEA, and while removing MEK by distillation under reduced pressure and at a heat source temperature of 45° C. Finally, a PGMEA solution of ANSM/EChMA copolymer having a polymer concentration of 15% by mass was obtained.

As a result of analyzing the resulting polymer solution by GPC, Mw was 7,020, and the ratio Mw/Mn was 1.59.

[Example 4] Production of ANSM/EChMA Copolymer

A quantity of 243 g of ANSM, 200 g of EChMA, 11.0 g of dimethyl 2,2-azobisisobutyrate, 0.2 g of triethylamine and 758 g of MEK were introduced into a container, followed by mixing, to prepare a monomer solution. In a separate container, 11.0 g of dimethyl 2,2-azobisisobutyrate and 22 g of MEK were introduced, followed by mixing, to prepare an initiator solution to be introduced before the monomer solution.

Into a 2-L four-necked flask reactor made of glass and equipped with a stirrer, a cooling device and a thermometer, 283 g of MEK was introduced, and a nitrogen atmosphere was created in the reactor, followed by heating to 79° C. The above-prepared initiator solution to be introduced before the monomer solution was added dropwise to the reactor at a constant rate over 10 minutes, and the mixture was maintained for another 10 minutes. Further, the above-prepared monomer solution was added dropwise to the reactor at a constant rate over 3 hours, and then the reaction was allowed to continue for another 2 hours. The temperature during the polymerization reaction was controlled within the range of from 79.0 to 81.0° C., and then lowered to room temperature after the completion of the polymerization.

The resulting polymerization solution was purified by performing reprecipitation and slurry washing under the same conditions as in Example 3, to obtain a wet powder of the polymer.

The recovered wet powder of the polymer was dissolved in 800 g of MEK. A part of the polymer solution was sampled, dried under reduced pressure at 30° C. to obtain a powder of the polymer, and the powder was subjected to an NMR analysis. The monomer composition ratio (molar ratio) in the polymer as determined by the NMR analysis was ANSM:EChMA=51.4:48.6.

The polymer solution after washing was distilled while adding PGMEA, and while removing MEK by distillation under reduced pressure and at a heat source temperature of 45° C. Finally, a PGMEA solution of ANSM/EChMA copolymer having a polymer concentration of 15% by mass was obtained.

As a result of analyzing the resulting polymer solution by GPC, Mw was 7,160, and the ratio Mw/Mn was 1.58. These physical properties were almost the same as those of the polymer obtained in Example 3.

[Evaluation of Dissolution Properties]

In order to compare the amounts of insoluble or poorly-soluble components contained in the respective PGMEA solutions of 4-HS/MCpMA copolymers obtained in Example 1 and Example 2, a test solution was prepared for each PGMEA solution, and the change in the turbidity when a poor solvent was gradually added to each test solution was measured in real time. The specific test method used will be described below.

(Step (i): Step of Preparing Test Solution)

Each of the polymer solutions obtained in Example 1 and Example 2 was further diluted with PGMEA to adjust the polymer concentration to 10.0% by mass, and used as a test solution.

(Step (ii): Step of Measuring Turbidity)

The turbidity was measured using a non-contact turbidity meter for use in orbital shaking culture (OD-Monitor A&S, manufactured by TAITEC Corporation, was attached to a shaker NR-2 and used). A quantity of 100.0 g of each test solution was introduced into a glass Erlenmeyer flask, and the opening of the Erlenmeyer flask was sealed with a plug equipped with a tube for adding a poor solvent dropwise, in order to prevent the solvent from evaporating. The conditions for orbital shaking were set to a shaking amplitude of 25 mm and a stirring rate of 200 rpm. The zero-point correction of the turbidity meter was performed in a state where the Erlenmeyer flask containing the test solution was being orbitally shaken. While orbitally shaking the Erlenmeyer flask, n-hexane as the poor solvent was added dropwise at a speed of 0.3 g/min. The changes in the weight and in the turbidity of the test solution during the dropwise addition were measured at intervals of 20 seconds. The measured value OD (optical density; the common logarithm of the transmittance of the transmitted light) of the turbidity meter used in this measurement is a value expressing the amount of transmitted light of infrared (950 nm) in terms of the $OD_{600}$ of *Escherichia coli*. The dropwise addition of n-hexane was continued until the turbidity reached 0.50 OD.

(Step (iii): Step of Calculating Amount of Solvent Added Dropwise)

In each test solution which had reached a turbidity of 0.50 OD, a slight turbidity of the solution was visible but no precipitation of the polymer was observed. Three measurements were carried out for each test solution, and the mean value of the amount of n-hexane added dropwise in the three measurements until the turbidity reached 0.10 OD, 0.15 OD, 0.20 OD, 0.30 OD or 0.50 OD, was summarized in Table 1.

TABLE 1

| Resist polymer | Raw material 4-HS (GPC purity) | Amount of n-hexane added dropwise* (g) 0.10 OD | 0.15 OD | 0.20 OD | 0.30 OD | 0.50 OD |
|---|---|---|---|---|---|---|
| Example 1 | 99.9% | 9.8 | 12.3 | 14.4 | 16.0 | 18.0 |
| Example 2 | 97.3% | 7.5 | 10.6 | 12.6 | 16.2 | 18.4 |

*The mean value of three measurements

Based on the results of the experiments, no difference was observed between Example 1 and Example 2 in the amount of n-hexane added dropwise required to cause a turbidity of 0.30 OD or more. However, a difference was observed in the amount of n-hexane added dropwise required to cause a turbidity of from 0.10 OD to 0.20 OD, namely, to cause an extremely low level of turbidity, and the results showed that the amount of n-hexane added dropwise was larger in Example 1. While the copolymer of Example 1 has almost the same physical properties, such as the monomer composition ratio, Mw, Mw/Mn and the amount of residual low molecular weight components, as the copolymer of Example 2, it can be evaluated that the amount of insoluble or poorly-soluble components which could cause development defects is lower in the copolymer of Example 1.

The preparation of the test solution and the measurement of the turbidity were carried out in the same manner as described above, for each of the PGMEA solutions of ANSM/ECpMA copolymers obtained in Example 3 and Example 4, in order to compare the amounts of insoluble or poorly-soluble components contained in the respective PGMEA solutions. The results are summarized in Table 2.

TABLE 2

| Resist polymer | Amount of n-hexane added dropwise* (g) 0.10 OD | 0.20 OD | 0.30 OD | 0.50 OD |
|---|---|---|---|---|
| Example 3 | 3.3 | 3.4 | 3.6 | 3.8 |
| Example 4 | 4.5 | 4.6 | 4.7 | 5.0 |

*The mean value of three measurements

Based on the results of the experiments, a difference was observed in the amount of n-hexane added dropwise required to cause a turbidity of from 0.10 OD to 0.50 OD, namely, to cause an extremely low level of turbidity, and the results showed that the amount of n-hexane added dropwise was larger in Example 4. While the copolymer of Example 4 has almost the same physical properties, such as the monomer composition ratio, Mw and Mw/Mn, as the copolymer of Example 3, it can be evaluated that the amount of insoluble or poorly-soluble components which could cause development defects is lower in the copolymer of Example 4.

The method according to the present invention was able to evaluate the dissolution properties of a resist polymer with less effort, by performing one sample preparation for one sample, and by performing a continuous dropwise addition of a poor solvent and measuring in real time the change in the turbidity associated therewith.

INDUSTRIAL APPLICABILITY

The method according to the present invention enables to easily evaluate the dissolution properties of a resist polymer, and to utilize the evaluation results for estimating the occurrence of development defects and the like during lithography.

The invention claimed is:

1. A method for evaluating the dissolution properties of a resist polymer, the method comprising the following steps (i) to (iii):

the step (i) of dissolving the resist polymer in a solvent to prepare a test solution;

the step (ii) of adding a solvent dropwise to the test solution while stirring the test solution, and measuring in real time the weight of the solvent added dropwise and the change in the turbidity of the test solution, as the dropwise addition proceeds; wherein the measurement range of the change in the turbidity of the test solution is within the range of 0.10 OD to 0.50 OD, and the step (iii) of calculating the weight of the solvent added dropwise until the turbidity of the test solution reaches a predetermined value.

2. The method for evaluating the dissolution properties of a resist polymer according to claim 1, wherein a container into which the test solution is introduced when measuring the turbidity in the step (ii) is an Erlenmeyer flask, and wherein the test solution is stirred by orbital shaking.

3. A method for producing a resist polymer, the method comprising:

the step of obtaining the resist polymer; and the step of evaluating the dissolution properties of the resulting resist polymer, using the method for evaluating the dissolution properties of a resist polymer according to claim 1.

4. The method for evaluating the dissolution properties of a resist polymer according to claim 1, wherein the solvent to prepare the test solution in the step (i) is a good solvent for the resist polymer.

5. The method for evaluating the dissolution properties of a resist polymer according to claim 1, wherein the test solution in the step (i) has the resist polymer concentration of from 2 to 25% by mass.

6. The method for evaluating the dissolution properties of a resist polymer according to claim 1, wherein the solvent added dropwise to the test solution in the step (ii) comprises a poor solvent for the resist polymer.

7. The method for evaluating the dissolution properties of a resist polymer according to claim 1, wherein the weight of the solvent added dropwise to the test solution in the step (ii) until the turbidity of the test solution reaches the predetermined value defined in the step (iii) is within the range of from 1 to 50% by mass with respect to the weight of the test solution.

8. The method for evaluating the dissolution properties of a resist polymer according to claim 1, wherein the speed of dropwise addition of the poor solvent is adjusted such that the time required from the start until the completion of the dropwise addition is from 5 minutes to 120 minutes.

9. The method for evaluating the dissolution properties of a resist polymer according to claim 1, wherein the turbidity is measured by any of the methods using a turbidity meter employing a transmitted light system, a scattered light system, an integrating sphere system or a surface scattering system in the step (ii).

10. The method for evaluating the dissolution properties of a resist polymer according to claim 1, wherein when a state in which the turbidity of the polymer solution is visible but only a slight amount of the precipitated polymer is observed, is taken as a standard, the predetermined value of the turbidity is set to a turbidity value that a turbidity of from 0.8 times to 0.1 times the standard occurs.

11. The method for producing a resist polymer according to claim 3, wherein the method comprising a step of purifying the resist polymer to remove the insoluble or poorly-soluble components included in the resist polymer before the evaluation step.

12. A method for evaluating the dissolution properties of a resist polymer, the method comprising the following steps (i) to (iii):

the step (i) of dissolving the resist polymer in a solvent to prepare a test solution;

the step (ii) of adding a solvent dropwise to the test solution while stirring the test solution, and measuring in real time the weight of the solvent added dropwise and the change in the turbidity of the test solution, as the dropwise addition proceeds; and the step (iii) of calculating the weight of the solvent added dropwise until the turbidity of the test solution reaches a predetermined value, wherein the predetermined value of the turbidity of the test solution is within the range of 0.10 OD to 0.50 OD.

* * * * *